US011187733B2

United States Patent
Assion et al.

(10) Patent No.: US 11,187,733 B2
(45) Date of Patent: Nov. 30, 2021

(54) BUS TERMINAL FOR AUTOMATION SYSTEM AND METHOD FOR MONITORING A CURRENT-SUPPLY NETWORK

(71) Applicant: Beckhoff Automation GmbH, Verl (DE)

(72) Inventors: Fabian Assion, Bielefeld (DE); Christian Lienen, Delbrück (DE); Jakob Ens, Harsewinkel (DE)

(73) Assignee: Beckhoff Automation GmbH, Verl (DE)

( * ) Notice: Subject to any disclaimer, the term of this patent is extended or adjusted under 35 U.S.C. 154(b) by 227 days.

(21) Appl. No.: 16/725,517

(22) Filed: Dec. 23, 2019

(65) Prior Publication Data

US 2020/0132738 A1 Apr. 30, 2020

Related U.S. Application Data

(63) Continuation of application No. PCT/EP2018/077921, filed on Oct. 12, 2018.

(30) Foreign Application Priority Data

Nov. 24, 2017 (DE) ...................... 10 2017 127 766.8

(51) Int. Cl.
*G01R 19/25* (2006.01)
*G01R 21/133* (2006.01)
*H02H 7/26* (2006.01)

(52) U.S. Cl.
CPC ..... *G01R 19/2513* (2013.01); *G01R 21/1331* (2013.01); *H02H 7/261* (2013.01)

(58) Field of Classification Search
CPC .............. G01R 19/2513; G01R 19/175; G01R 21/1331; H02H 7/261; H02H 7/30;
(Continued)

(56) References Cited

U.S. PATENT DOCUMENTS 5,631,931 A * 5/1997 Takano ................... H03L 7/143
375/347
7,702,834 B2 * 4/2010 Beckhoff ............. G05B 19/042
710/110
(Continued)

FOREIGN PATENT DOCUMENTS

DE 2155470 B 6/1972
DE 3117284 C2 1/1988
(Continued)

OTHER PUBLICATIONS

Yin, Jie, et al. "Design of 1553B Bus Testing and Simulating System." 2013 Ninth International Conference on Intelligent Information Hiding and Multimedia Signal Processing. IEEE, 2013. (Year: 2013).*
(Continued)

*Primary Examiner* — Christopher P Mcandrew
(74) *Attorney, Agent, or Firm* — Dorsey & Whitney LLP

(57) ABSTRACT

Measuring data are provided for monitoring a current-supply network, based on one or a plurality of measured electrical quantities of the current-supply network. A time signal is assigned to the measuring data. The measuring data are inspected for the occurrence of one a plurality of predetermined events. Based on determining the occurrence of predetermined event or events, corresponding event data based on the measuring data are generated. A time stamp is conferred to the event data, where the time stamp is based on a link of a synchronized clock time provided by a clock and the time signal assigned to the measuring data. User data are generated from the event data comprising the time stamp, and transmitted via a communication network.

13 Claims, 11 Drawing Sheets

(58) Field of Classification Search
CPC ........... H02J 13/00002; H02J 13/00028; H02J 13/0004; H02J 13/00034; Y02E 60/00; Y04S 10/20
USPC .................................................. 324/764.01
See application file for complete search history.

(56) References Cited

U.S. PATENT DOCUMENTS

| 8,001,306 | B2* | 8/2011 | Beckhoff | H04L 12/423 |
| | | | | 710/110 |
| 8,055,826 | B2* | 11/2011 | Janssen | H04L 12/437 |
| | | | | 710/110 |
| 2003/0050041 | A1* | 3/2003 | Wu | H04L 12/14 |
| | | | | 455/406 |
| 2004/0156462 | A1* | 8/2004 | Fuehrer | H04L 12/403 |
| | | | | 375/354 |
| 2005/0053098 | A1* | 3/2005 | Rabenko | H04J 3/0664 |
| | | | | 370/503 |
| 2017/0131343 | A1 | 5/2017 | Schweitzer, III et al. | |
| 2017/0371832 | A1* | 12/2017 | Wei | G06F 13/4291 |

FOREIGN PATENT DOCUMENTS

| DE | 69223998 | T2 | 4/1998 |
| DE | 102009048935 | A1 | 2/2011 |
| DE | 102014105211 | A1 | 10/2015 |
| DE | 102015218911 | A1 | 1/2017 |
| EP | 2017870 | B1 | 6/2007 |
| EP | 1900088 | B1 | 3/2008 |
| EP | 2977772 | A1 | 1/2016 |
| WO | 20150180766 | A1 | 12/2015 |

OTHER PUBLICATIONS

Dennis, Philip, et al. Test Bus Evaluation. Texas Instruments Inc Plano Defense Systems and Electronics Group, 1998. (Year: 1998).*

Prakash, Tapan, Vinay Pratap Singh, and Soumya R. Mohanty. "A synchrophasor measurement based wide-area power system stabilizer design for inter-area oscillation damping considering variable time-delays." International Journal of Electrical Power & Energy Systems 105 (2019): 131-141. (Year: 2019).*

Kihara, Masami. "Performance aspects of reference clock distribution for evolving digital networks." IEEE Communications Magazine 27.4 (1989): 24-34. (Year: 1989).*

Kartaschoff, Peter. "Synchronization in digital communications networks." Proceedings of the IEEE 79.7 (1991): 1019-1028. (Year: 1991).*

Janitza Electronics GmbH, "20CM and 20CM-CT6 module", pp. 1-8, Published in: Germany.

Bachmann Electronic GmbH, "Grid Measurement Modules", Nov. 2019, pp. 1-3, Published in: Germany.

Bachmann Electronic GmbH, "Grid measurement and protection module", Dec. 2016, pp. 1-2, Published in: Germany.

Bender, "LINETRAXX RCMS460", Dec. 22, 2019, pp. 1-3.

Beckhoff Automation GmbH, "EtherCAT Slave Controller ET1100", May 3, 2010, pp. 1-100, Published in: Germany.

Beckhoff Automation GmbH, "EtherCAT Slave Controller", Feb. 21, 2017, pp. 1-25, Published in: Germany.

Janitza Electronics GmbH, "103-CBM energy meter with memory", May 2019, pp. 1-16, Published in: Germany.

Siemens, "6ES71346PA010BD0", Dec. 2019, pp. 1-6.

Siemens, "6ES71346PA200BD0", Dec. 2019, pp. 1-6.

WAGO Kontakttechnik GmbH & Co. KG, "3-Phase Power Measurement; 480 VAC, 1 A; light gray", Dec. 23, 2019, pp. 1-14, Published in: Germany.

WAGO Kontakttechnik GmbH & Co. KG, "3-Phase Power Measurement; 690 VAC, 1 A; light gray", Dec. 23, 2019, pp. 1-14, Published in: Germany.

WAGO Kontakttechnik GmbH & Co. KG, "Remote Access Via GPRS and SMS", Jan. 2017, pp. 1-50, Published in: Germany.

* cited by examiner

BUS TERMINAL FOR AUTOMATION SYSTEM AND METHOD FOR MONITORING A CURRENT-SUPPLY NETWORK

CROSS-REFERENCE TO RELATED APPLICATIONS

This patent application claims priority to International Patent Application PCT/EP2018/077921, filed 12 Oct. 2018, entitled BUS TERMINAL FOR AN AUTOMATION SYSTEM AND METHOD FOR MONITORING A POWER SUPPLY NETWORK, and German patent application DE 10 2017 127 766.8, filed Nov. 24, 2017, entitled BUSKLEMME UND VERFAHREN ZUM ÜBERWACHEN EINES VERSORGUNGSSTROMNETZES EINES AUTOMATISIERUNGSSYSTEMS, each of which is hereby incorporated by reference herein, in the entirety and for all purposes.

FIELD

The present invention relates to a bus terminal for an automation system or, respectively, to an automation system and a method for monitoring a current-supply network.

BACKGROUND

EP patent 2 017 870 B1 describes a system and a method to allow for switching a micro-electromechanical switch during zero crossing by measurements, wherein the following components are provided: load circuit, detection circuit, alternating-voltage source, load-alternating current, voltage-measuring circuit, current-measuring circuit, micro-electromechanical switch.

German patent DE 2 155 470 B describes a digital zero-crossing determination process of a sinusoidal alternating-current signal having a fixed sampling cycle. A zero crossing is determined by generating a product of two subsequent measuring values and, if said value is negative, calculating a linear interpolation between the two values in order to determine the zero crossing. In order to determine the frequency, the time interval between the crossings is ascertained.

In the field of electrical-energy technology, the term distributed current-supply network refers to networks having electrical current lines such as overhead lines and buried cables and the associated units such as control units and transformer stations and the power plants and consumers connected thereto. Large, spatially adjacent and electrically connected current-supply networks are e.g. referred to as interlinked networks; small, spatially separate current-supply networks are e.g. referred to as island networks.

In distributed current-supply networks, only very old technology has so far been used which ensures safe switching-off of parts of the current-supply network in case of occurring errors. Such an error may e.g. be a short circuit within a part and/or a component of the current-supply network. Disadvantages of this technology are the unprecise localizing of the errors shortly after they occur and the missing access to the time-dependent spread of the error. The reason for this is that only a very rough synchronization of the clock time of the various measuring points takes place within the current-supply network. As a result, the various measuring points indicate the occurrence of an error with an offset of up to several seconds with regard to each other although the error may spread with a speed that may amount to the speed of light. Moreover, it is not mandatorily the fuse closest to the error that separates the faulty part of the current-supply network. This means that large parts of the current-supply network are sometimes switched off unnecessarily, thus cutting off consumers from the supply.

SUMMARY

An object underlying the present disclosure can be seen in providing a concept for efficiently monitoring a current-supply network.

EXAMPLES

According to a first aspect, a bus terminal for an automation system for monitoring a current-supply network is provided, the bus terminal comprising:
a first clock, and
a communication interface for communicating via a communication network of the automation system,
wherein the communication network is configured to receive a reference time via the communication network, and
wherein the communication interface is configured to synchronize the clock time of the first clock to the reference time,
a measuring converter configured as a digitizer for measuring one or a plurality of electrical quantities of the current-supply system in order to provide digital measuring data correspondingly based on the one or on the plurality of measured electrical quantities, and
a processor unit comprising:
a second clock configured to generate a time signal based on a provision signal supplied to the second clock by the measuring converter, wherein the second clock is furthermore configured to trigger the first clock to periodically provide the synchronized clock time,
a first link unit configured to assign the time signal to the provided digital measuring data,
a searching unit configured to inspect the provided digital measuring data and/or the first derived data based on the provided digital measuring data for the occurrence of one or a plurality of predetermined events in order to generate event data based on the digital measuring data and/or on the first derived data of the event or of the events on the basis of determining the occurrence of one or a plurality of predetermined events,
a second link unit configured to confer a time stamp to the event data and/or to the derived data based on the event data in order to generate user data in this way, wherein the time stamp is based on a linking of the synchronized clock time provided by first clock and the time signal assigned to the digital measuring data of the event or of the events,
wherein the communication interface is configured to transmit the generated user data via the communication network.

According to a second aspect, a method for monitoring a current-supply network by using the bus terminal is provided, comprising the following steps:
receiving a reference time via the communication network,
synchronizing the clock time of the first clock to the reference time,
measuring one or a plurality of electrical quantities of the current-supply network by the measuring converter configured as a digitizer, providing digital measuring data based on the one or plurality of measured electrical quantities, supplying a provision signal from the measuring converter to the second clock as soon as digital measuring data have been provided, generating a time signal on the part of the second clock when the provision signal is supplied, periodic triggering of the first clock on the part of the second clock to provide the synchronized clock time, assigning the time signal to the provided digital measuring data, inspecting the provided digital measuring data and/or the first derived data based on the provided digital measuring data for the occurrence of one or a plurality of predetermined events, based on determining the occurrence of one or a plurality of predetermined events, generating of corresponding event data based on the digital measuring data and/or on the first derived data of the event or events, conferring a time stamp to the event data and/or to the second derived data based on the event data, wherein the time stamp is based on a linking of the synchronized clock time provided by the first clock and the time signal assigned to the digital measuring data of the event or of the events, generating of user data from the event data comprising the time stamp and/or from the second derived data comprising the time stamp on which the event data are based, and transmitting the generated user data via the communication network.

The above object can be solved by the fact that by the bus terminal it is possible to specifically search for one or a plurality of predetermined events within the measuring data and/or within the first derived data based on the measuring data, wherein the searched events represent corresponding events within the current-supply network. The discovered events are then linked to a time stamp, wherein the time stamp moreover has a time link to the digital measuring data, the time stamp thus particularly depending on a point in time of the measurement of one or of a plurality of electrical quantities. Assigning the time stamp is carried out by a processor unit.

This means that relative to the reference time, the time stamp provides a time information which e.g. indicates when with regard to the reference time the digital measuring data have been measured or, respectively, provided or, respectively, when the searched event(s) in the current-supply network has/have occurred.

The user data provided with such a time stamp are transmitted via the communication network and may in this way be provided to other communication subscribers of the automation system which may also be referred to as communication network or field-bus system. Another communication subscriber of the automation system may be configured to control the automation system. The communication subscriber may also be a master or, respectively, a field-bus mater of the automation system. Similarly, the communication subscriber may be one or a plurality of any desired other subscribers, such as a field-bus coupler and/or a bus terminal which may also be referred to as a field-bus terminal, in the field-bus system. The bus terminal may as a result itself be a communication subscriber in the automation system or be addressed as an ordinary subscriber of the field-bus system. The user data may be exchanged with the other communication subscribers via the field bus. An external wiring in order to connect the bus terminal is thus not required.

In an alternative embodiment of the bus terminal, the bus terminal may also be configured as a separate component within the automation system, wherein the bus terminal may then be connected to the automation system by corresponding wiring.

In this way, the user data having the time stamp may advantageously be categorized with respect to time for the automation system. This e.g. means that various user data of several bus terminals may be compared to each other under a time aspect and e.g. brought into chronological order as the internal clocks of the several bus terminals have been synchronized to the same reference time.

This e.g. has the technical advantage that an error within the current-supply network may be located efficiently and without delay.

This may further e.g. have the technical advantage that only the fuse closest to the error location separates the faulty part of the current-supply network from the rest of the network. This has the particular advantage that large parts of the supply network are not switched off unnecessarily.

The wording "bus terminal for an automation system" is meant to imply the wording "bus terminal of an automation system", and vice versa.

An embodiment comprises the automation system which comprises the bus terminal.

In another embodiment, the automation system comprises the communication network.

In another embodiment, the automation system comprises the current-supply network.

In another embodiment, the current-supply network comprises the bus terminal.

The wording "for monitoring a current-supply network" is meant to imply the wording "for monitoring a current-supply network of the automation system".

A zero crossing is e.g. a zero crossing of a voltage and/or of a current and/or of a quantity derived from the voltage or, respectively, the current.

An advantageous embodiment of the bus terminal provides that the processor unit comprises a first evaluation unit that receives the digital measuring data assigned by the time stamp from the first link unit, wherein the first evaluation unit is configured to link the digital measuring data to the further digital measuring data and/or to process the digital measuring data by a mathematical function in order to thus generate first derived data that may be supplied to the searching unit.

This may e.g. have the technical advantage that the first derived data supplied to the searching unit have been preprocessed or linked or processed in such a way that searching for the occurrence of one or a plurality of predetermined events is simplified or e.g. rendered possible at all. In this way, e.g. a mean value may be each generated from a plurality of provided digital measuring data which is supplied to the searching unit as first derived data so that the searching unit altogether has to process a lower number of data during the search. Alternatively, it is e.g. necessary to calculate an electrical power from the digital measuring data of voltage and current provided by the measuring converter at first by multiplying the voltage value by the current value, the electrical capacity being then fed to the searching unit as first derived data, provided that the predetermined event(s) may be found by a value of the electrical power.

In another advantageous embodiment of the bus terminal, the processor unit comprises a second evaluation unit receiving the event data from the searching unit, wherein the second evaluation unit is configured to link the event data to further event data and/or to further digital measuring data and/or to process the event data by a mathematical function in order to thus generate second derived data that may be supplied to the second link unit.

This may e.g. have the technical advantage that the second derived data supplied to the second link unit have been preprocessed or linked or processed in such a way that the link of the second derived data to the time stamp is simplified or e.g. rendered possible at all. If e.g. the zero-crossing is to be very precisely determined by the bus terminal, the searching unit would e.g. search for a change of sign as an event within the digital measuring data provided by the measuring converter. Provided that a change of sign occurs among the measuring data, the searching unit of the second evaluation unit would forward the digital measuring value directly prior to the change of sign and the digital measuring value directly after the change of sign. The second evaluation unit would then calculate or, respectively, generate the precise zero crossing with the associated derived time signal e.g. by a linear approximation from the digital measuring value and the associated time signal prior to the change of sign and the digital measuring value and the associated time signal after the change of sign, and supply these data to the link unit as second derived data.

First derived data generated by the first evaluation unit and/or second derived data generated by the second evaluation unit may e.g. comprise: an effective value of a measured electrical voltage, an effective value of a measured electrical current, an effective value of a phase voltage, an active power, an apparent power, a reactive power, a performance factor or power factor, a frequency, harmonics of the string voltage or string current, an active energy per phase, a total active energy, a mean value of an apparent power and/or of a reactive power.

According to an embodiment of the bus terminal, it is provided that the processor unit comprises a first evaluation unit as well as a second evaluation unit.

According to another embodiment, the one or the plurality of predetermined events are e.g. selected from the following group of events:
- a voltage drop in the current-supply network below a predetermined voltage-threshold value,
- a voltage increase in the current-supply network over a predetermined voltage-threshold value,
- a current drop in the current-supply network below the predetermined current-threshold value,
- a current increase in the current-supply network over a predetermined current-threshold value,
- a chronological development of a measured electrical quantity corresponding to a predetermined desired time development or deviating from it and/or
- the occurrence of a zero crossing of a phase in a current-supply network configured as an a.c. network.

It is particularly provided that the one or the plurality of predetermined events are selected from the following group of events:
- an electrical excess voltage in the current-supply network,
- an electrical excess current in the current-supply network,
- a maximum value or minimum value of an active power,
- a maximum value of current input,
- a minimum value or, respectively, maximum value of an effective value of a measured electrical current, and/or
- a minimum value or, respectively, maximum value of an effective value of a measured electrical voltage.

This e.g. has the technical advantage that the parameter(s) relevant for monitoring may be effectively determined.

According to an embodiment, the bus terminal comprises a memory for storing one or a plurality of programs for inspecting by a searching unit, for generating first derived data by the first evaluation unit and/or for generating second derived data by the second evaluation unit, wherein the processor unit is configured to read out the program(s) from the memory and execute them, wherein the communication interface is configured to receive the program(s) and/or the update data for the program(s) via the communication network, wherein the processor unit is configured to save the received program(s) in the memory and/or to update the program(s) based on the update data.

This e.g. has the technical advantage that the bus terminal may be provided with one or a plurality of updated program(s) even after installing. In particular, this achieves the technical advantage that the bus terminal may be remotely programmed via the communication network. In particular, this has the technical advantage that an end user of the bus terminal may program it in line with their needs. This particularly achieves a high flexibility with regard to monitoring the current-supply network. Thus, for the end user, the bus terminal is not a "black box" that they cannot program themselves, but which can be configured or, respectively, programmed as desired.

In an embodiment, the current-supply network is a multi-phase a.c. network.

For example, the multi-phase a.c. network is a three-phase a.c. network.

In one embodiment, the communication network is an EtherCAT communication network.

In one embodiment, the communication interface is an EtherCAT communication interface.

In one embodiment, the EtherCAT communication interface is configured to insert the user data into an EtherCAT telegram. In one embodiment, the synchronizing process comprises synchronizing according to the "distributed clock" specification according to "Hardware Data Sheet Section 1 EtherCAT Slave Controller" version 2.3 (21 Feb. 2017); section I; sub-section 9, "Distributed Clocks," pages I-52 to I-74, Beckhoff Automation GmbH & Co. KG.

German Publication DE 10 2014 105 211 A1 also discloses a method which allows a high time resolution within a communication network by synchronizing a plurality of distributed clocks. By reference, the entire contents of the mentioned publication is made a subject matter of the present disclosure.

According to an embodiment, the bus terminal is configured or provided to carry out or execute the method for monitoring a current-supply network of an automation system.

Technical functionalities of the bus terminal analogously result from the corresponding technical functionalities of the method, and vice versa.

According to an embodiment, the processor unit comprises a microcontroller, e.g. an ARM microcontroller. According to an embodiment, the microcontroller comprises a floating point unit.

According to an embodiment, the electrical quantity/quantities comprise(s) an electrical voltage and/or an electrical current.

Provided that the current-supply network is a multi-phase a.c. network, it is provided in one embodiment that the one or the plurality of electrical quantities is measured for one or for a plurality or for all of the phases of the multi-phase current-supply network. This particularly means that e.g. one or a plurality of electrical quantities are measured for each phase.

In one embodiment, the current-supply unit is an interlinked network or an island network.

BRIEF DESCRIPTION OF THE DRAWINGS

The invention is explained in greater detail below on the basis of preferred exemplary embodiments with reference to figures, in which.

DETAILED DESCRIPTION

Figure 1:
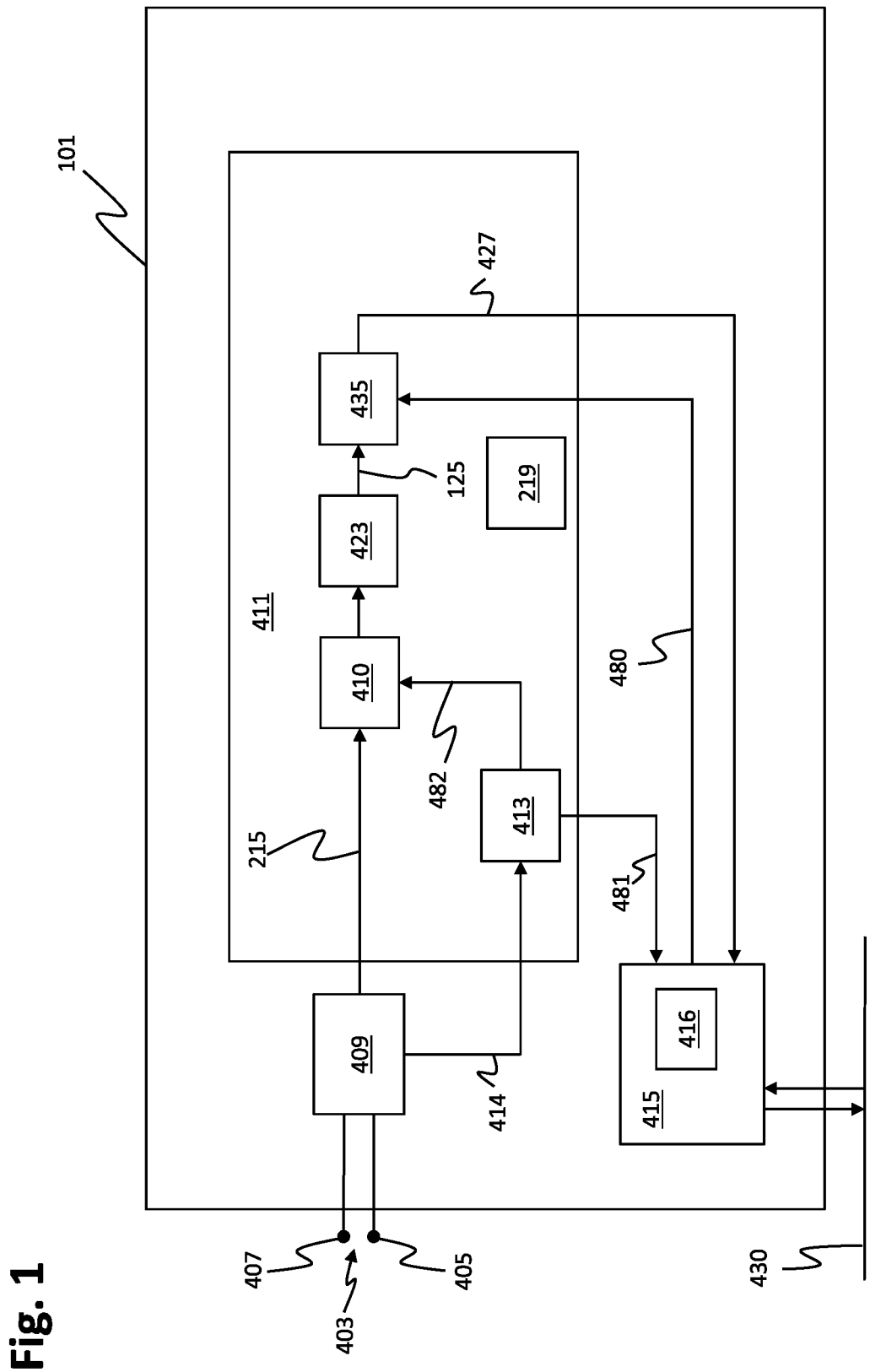
FIG. 1 shows a first bus terminal.

In the following, same reference numerals are used for same features in the figures.

FIG. 1 shows a first bus terminal 101 of an automation system for monitoring a current-supply network 403.

The automation system comprises a communication network 430 that may also be referred to as a field-bus system, by which communication data that may also be referred to as field-bus data, may be exchanged between the individual subscribers of the automation system.

The communication network 430 is e.g. a communication network 430 according to the EtherCAT standard, e.g. according to the IEC 61158-3/4/5/6-12 standard.

With regard thereto, the first bus terminal 101 comprises a communication network 415, e.g. an EtherCAT communication network that is e.g. configured as an EtherCAT ASIC (application specific integrated circuit) for communicating via a communication network 430 of the automation system.

The communication network 415 is configured to receive a reference time via the communication network 430. The reference time is e.g. generated by a subscriber of the communication network 430 according to the "distributed clock" specification according to "Hardware Data Sheet Section 1 EtherCAT Slave Controller" version 2.3 (21 Feb. 2017); section I; subsection 9, "Distributed Clocks," pages I-52 to I-74, Beckhoff Automation GmbH & Co. KG," and then distributed in the communication network according to the method described and disclosed in the prior art.

The communication network 415 or, respectively, the EtherCAT ASIC has a first clock 416. In particular, the communication interface 415 is configured to synchronize the clock time of the first clock 416 to the reference time.

The bus terminal 101 further comprises a measuring converter 409 configured as a digitizer for measuring one or a plurality of electrical quantities of the current-supply network 403. The current-supply network 403 is e.g. an a.c. network and comprises multiple phases wherein for clarity reasons only one phase 407 is depicted herein. The current-supply network 403 comprises a neutral conductor 405.

For example, the measuring converter 409 measures an electrical voltage and/or an electrical current, in particular an electrical voltage between the phase 407 and the neutral conductor 405.

The measuring converter 409 provides digital measuring data 215 corresponding to the one or the plurality of measured electrical quantities.

The first bus terminal 101 comprises a processor unit 411 comprising a second clock 413. As soon as the measuring converter 409 provides new digital measuring data 215, it additionally supplies a corresponding provision signal 414 to the second clock 413. As a result, the second clock 413 generates a time signal 482. The time signal 482 may e.g. not be an absolute time information within a larger system, but a relative time information relating to second clock 413. For example, the second clock 413 is a simple timer that may e.g. generate five-thousand time signals within one second. The described time resolution, i.e. the amount of time signals per time unit, in particular per second, is used for reasons of simplification only. In an advantageous embodiment, this time resolution may be much higher, e.g. 100 ns, which corresponds to ten million time signals per second. After said five-thousand time signals, the timer starts counting again at point zero until it has again reached five-thousand.

The second clock 413 is furthermore configured to cause the first clock 416 to periodically provide the synchronized clock time 480. For this purpose, the second clock 413 e.g. transmits a clock-time-provision signal 481 to the first clock whenever the count of the five-thousand time signals starts. Said clock-time-provision signal 481 is e.g. a 1-bit message. According to the described example, a corresponding clock-time-provision signal 481 would be transmitted to the first clock 416 by the second clock 413 every second.

Moreover, the processor unit 411 comprises a first link unit 410. The first link unit 410 is configured to assign the time signal 482 generated by the second clock to the digital measuring data 215. This time signal 482 then refers to the measuring data 215 and is, as described, generated as soon as the provision signal 414 is supplied to the second clock 413. The measuring data 215 are for example provided at a point in time X. The measuring converter 409 then generates the provision signal 414 and supplies it to the second clock 413. If, for example, the second clock 413 is at that moment at count one-thousand two-hundred and fifty, the second clock 413 transmits the value one-thousand two-hundred and fifty to the link unit 410 as the time signal 482. The link unit 410 then links the generated measuring data 215 to the time signal 482, i.e. to the value one-thousand two-hundred and fifty.

Moreover, the first bus terminal 101, in particular the processor unit 411, comprises a searching unit 423. The searching unit 423 is configured to inspect the digital measuring data 215 supplied by the first link unit 410 for the occurrence of one or a plurality of predetermined events. The predetermined event may e.g. be a maximum voltage within a fixed number of measuring data 215. Based on the determination of the occurrence of the predetermined event(s) within the measuring data 215, the searching unit 423 then generates event data 125. Said event data 125 may e.g. only comprise the measuring data 215 of the maximum voltage value within the predetermined number as only these data are of interest when proceeding with regard to the predetermined event.

The processor unit 411 further comprises a second link unit 435. The second link unit 435 receives the event data 125 that of course comprise the corresponding time signals 482 assigned within the first link unit 410. The second link unit 435 then provides the event data 125 with a time stamp which is based on a linking of the synchronized clock time 480 provided by the first clock and the time signal assigned to the digital measuring data 215 of the event. The synchronized clock time 480 e.g. consists of a date and a corresponding global clock time, i.e. the reference time that is precise to the nanosecond. The time signal 482 assigned to the event, in the above example the maximum voltage within a predetermined number of measuring data 215, is the value one-thousand two-hundred and fifty.

Since, according to the above description, it is known that the second clock 413 always transmits the clock-time-provision signal 481 to the first clock 416 within one second at the start of its five-thousand time signals, and the time signal has the value one-thousand two-hundred and fifty, the maximum value of the voltage within the predetermined number of measuring data was measured at the one-thousand-two-hundred-and-fiftieth part of a second after transmitting the last clock-time-provision signal 481. As a result, this value may be linked to the synchronized clock time 480 by e.g. adding 0.25 seconds to the synchronized clock time 480. This linked clock time then forms the time stamp for the moment of the maximum voltage. The event data 125 thus linked to the time stamp are transmitted to the communication interface 415 as user data 427, the communication interface 415 being configured to send the user data 427 via the communication network 430.

As a result, a control of the automation system is e.g. provided with the user data 427 of the first bus terminal 101, which are provided with a time information, represented by the time stamp, comparable for the entire automation system, the reason being that this time stamp was determined on the basis of the reference time.

User data from other bus terminals of the automation system provided with an analogously determined time stamp may thus be compared to each other with regard to time. In particular, these user data of the bus terminals may be brought into chronological order due to the consistent time basis.

The control unit may thus advantageously and efficiently use the user data of the bus terminals for further diagnosis and/or control processes.

According to an embodiment, the processor unit 411 comprises a microcontroller, preferably an ARM microcontroller. The microcontroller e.g. comprises a floating point unit.

The processor unit 411 comprises a memory 219 in which e.g. a program for inspecting the provided digital measuring data 215 by the searching unit is stored. The processing unit 411 carries out the program for inspecting the digital measuring data 215.

The communication interface 415 is configured to receive update data for the program(s) via the communication network 430. The communication interface 415 is e.g. configured to receive a program for inspection via the communication network 430.

The processor unit 411 then e.g. updates the program based on the update data. The processor unit 411 e.g. stores the received program in the memory 219.

This advantageously allows for re-programming the first bus terminal 101 via the communication network 430. Moreover, this advantageously allows an end user to carry out evaluations of the measured electrical quantities that are adapted to the individual case at issue.

Compared to this, bus terminals used so far and other previous units for measuring electrical quantities in a current-supply network had the disadvantage of being configured as so-called "black boxes" carrying out an evaluation of the measured quantities predetermined by the manufacturer, with the end user having no influence thereon or, respectively, not being able to change the evaluation.

Moreover, bus terminals used so far had the disadvantage that a precise time assignment of the measured or, respectively, evaluated quantities was not possible, because the bus terminals used so far did not synchronize their internal clocks to a reference time or because the point in time of measuring and the chronological influence of the evaluation were unknown.

Due to the bus terminal, the end user obtains higher flexibility and scalability with regard to using or, respectively, monitoring the current-supply network.

Figure 2:
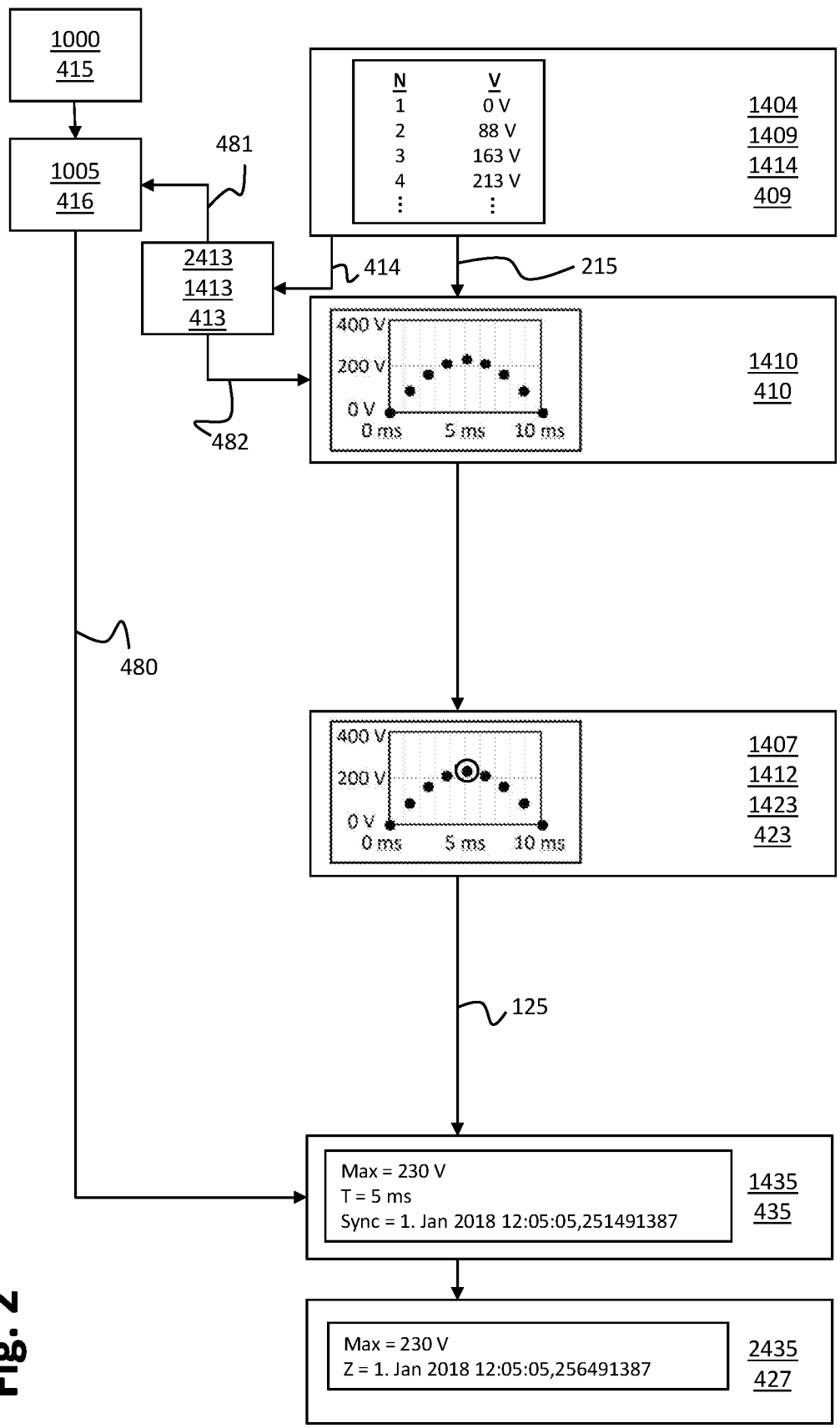
FIG. 2 depicts a flow chart of a method for monitoring a current-supply network by the first bus terminal.

FIG. 2 shows a schematic exemplary flow chart of a method for monitoring a current-supply network by using the first bus terminal 101.

For a better understanding, the individual blocks of the method of FIG. 2 partly comprise the added reference numerals of the corresponding associated devices of FIG. 1. In addition, the following description mentions the corresponding reference numerals used in FIG. 1.

The method starts with receiving 1000 a reference time from the communication interface 415 via the communication network 430. By said reference time, the clock time of the first clock 416 is synchronized 1005.

In the shown example, measuring 1404 of an electrical quantity of the current-supply network 403 by the measuring converter 409 is simultaneously carried out, in this case measuring of an electrical voltage of a phase 407 of the current-supply network 403. In FIG. 2, measuring 1404 is symbolically depicted by a table into which measuring data are inserted continuously. In this context of FIG. 2, the measuring data are assigned to a number symbolizing the order of measuring data. The individual voltage values are provided 1409 by the measuring converter 409. For example, a voltage value of 0V is provided 1409 as first measuring date 215, a voltage of 88V as second measuring date 215, a voltage value of 163V as third measuring date 215, a voltage value of 213V as fourth measuring date 215 and so on.

The provided digital measuring data 215 are individually transmitted to the first link unit 410. Simultaneously to providing 1409 and transmitting the digital measuring data, for each measuring date 215 a provision signal 414 is supplied 1414 to the second clock 413 by the measuring converter 409. The second clock 413 thereupon generates 1413 a time signal 482 which the second clock 413 supplies to the first link unit 410. The time signal 482 is e.g. not an absolute time information within a larger system, but a relative time information with regard to a second clock 413. As has been described in conjunction with FIG. 1, the second clock 413 is e.g. a simple timer which may e.g. generate five thousand time signals within one second. After these five thousand time signals, the timer takes up counting re-starting at zero up until reaching five thousand again.

In the first link unit 410, the digital measuring data 215 are then assigned 1410 to the time signals 482. As a result, a voltage/time diagram is generated which in the shown example comprises one voltage value per 1.25 milliseconds. This corresponds to a data-provision rate of 800 measuring data per second. This data-provision rate serves to illustrate the method. In a preferred embodiment, the data-provision rate may be much higher, e.g. nine-thousand seven-hundred measuring data per second or e.g. between eight-thousand measuring data per second and twelve-thousand measuring data per second.

In a next step, the digital measuring data 215 are inspected 1423 for a predetermined event. In the shown example, e.g. a maximum voltage value is looked for as a predetermined event. Thus, the searching unit 423 inspects 1423 the provided digital measuring data 215 for a maximum value. Finding the maximum voltage value, i.e. the occurrence 1407 of the predetermined event within the framework of the inspection 1423 is in FIG. 2 indicated and symbolized by a circle around the corresponding value. Due to the occurrence 1423 of the predetermined event, event data 125 are generated 1412 on the basis of the measuring data 215. As the event is the maximum voltage value of 230V, indicated in FIG. 2 with the reference Max, and this maximum voltage value is assigned the time signal 482 of 5 ms, characterized in FIG. 2 by the reference T, the event data 125 in this case consist of the two values 230V and 5 ms which are then supplied to the second link unit 435. As an alternative, however, it is also possible that the event data 125 comprise an additional information on which searched event or, respectively, on which searched events the event data 125 are based. In the mentioned example, the additional information would then be an information with regard to the searched maximum voltage value.

Independent of or, respectively, in parallel to the method steps described previously, a periodic triggering 2413 of the first clock 416 by the second clock 480 takes place to provide the synchronized clock time 480. Said periodic triggering 2413 is e.g. carried out at every count start of the five-thousand time signals of the second clock 413 by transmission of a clock-time-provision signal 481 to the first clock 416. According to the above-described example, a corresponding clock-time-provision signal 481 would be transmitted from the second clock 413 to the first clock 416 every second. Due to said triggering 2413, the synchronized clock time 480 is supplied to the second link unit 435. In the example depicted in FIG. 2, the synchronized clock time 480 is: 1 Jan. 2018; 12:05:05.251491387, indicated in FIG. 2 by the term Sync.

In the second link unit 435, the event data 125 are then provided 1435 with a time stamp. Said time stamp is based, as described, on a linking of the synchronized clock time 480 provided by the first clock 416 and the time signal 482 assigned to the digital measuring data of the event. According to the example, the synchronized clock time 480 having the value 1 Jan. 2018; 12:05:05.251491387 is added to the value of the time signal 482 associated with the searched event, i.e. the maximal voltage value, i.e. 5 ms according to the mentioned example. This results in a time stamp, characterized in FIG. 2 by the letter Z, having the value: 1 Jan. 2018; 12:05:05.256491387.

By providing 1435 the event data 125 with the time stamp, the user data 427 are generated 2435, which are then transmitted via the communication network in a final method step.

Provided that the described method steps have been performed several times one after another, it is additionally possible in an embodiment of the inventive method to examine the flawless functionality of the second clock 413 by the bus terminal. For example, it may happen that the timer of the second clock 413 shifts in such a way that it does not generate the above-described five-thousand time signals within a second, but a shorter or longer duration of time for this. For example, it could be assumed that the second clock requires 1.2 seconds for counting the five-thousand time signals. This means that only every 1.2 seconds a clock-time-provision signal 481 is transmitted to the first clock 416.

As, however, the time signal 482 assigned to the event is only relatively represented within a time period with regard to the five-thousand time signals, this would result in an inaccuracy with regard to the time stamp when linking the synchronized clock time to the time signal. In order to counteract this, it may be provided in the not-shown embodiment that the quotient from the time signal assigned to the event and the entirety of time signals within a counting period is multiplied by the difference between the transmitted synchronized clock time of the previous monitoring interval and the synchronized clock time of the current monitoring interval. This product is then added to the synchronized clock time of the current monitoring interval so that the sum forms the time stamp.

Figure 3:
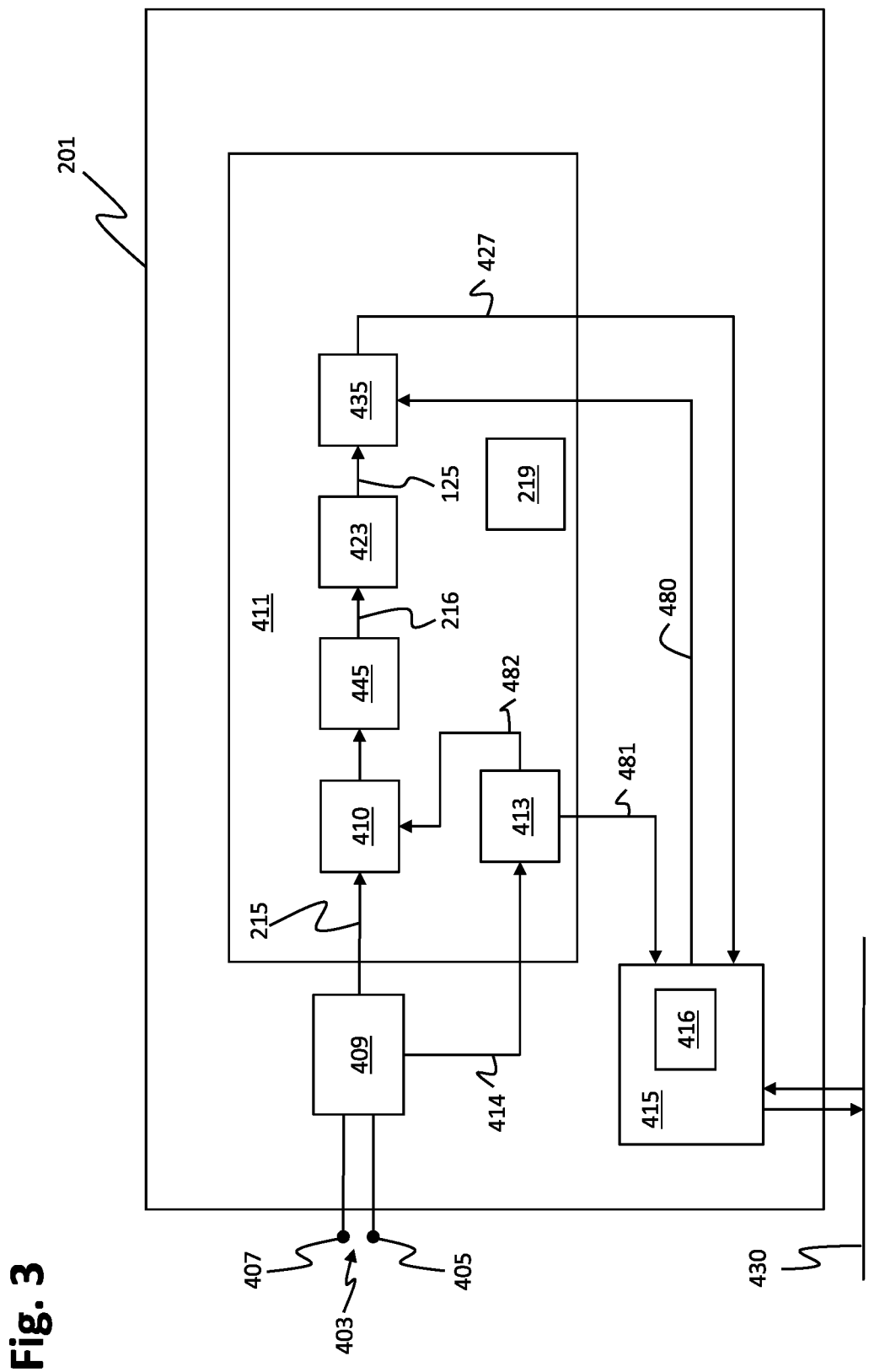
FIG. 3 shows a second bus terminal.

FIG. 3 shows a second bus terminal 201 of an automation system for monitoring a current-supply network 403.

The second bus terminal 201 essentially corresponds to the first bus terminal 101 of FIG. 1 with regard to design and functionality so that, in order to avoid repetitions, only the differences are explained in the following.

Apart from the units of the first bus terminal 101 described in conjunction with FIG. 1, the second bus terminal 201, particularly the processor unit 411 comprises a first evaluation unit 445 which is functionally arranged between the first link unit 410 and the searching unit 423. The first evaluation unit 445 is configured to receive the digital measuring data 215 assigned by the time signal 482 from the first link unit 410. The digital measuring data 215 are then e.g. linked to further digital measuring data 215 by the first evaluation unit 445 and/or the digital measuring data 215 are processed by a mathematical function. As a result, first derived data 216 are generated from the digital measuring data 215 which are then transmitted to the searching unit 423 instead of the digital data 215 and further processed in analogy to the procedure described above with reference to the digital data 215.

Figure 4:
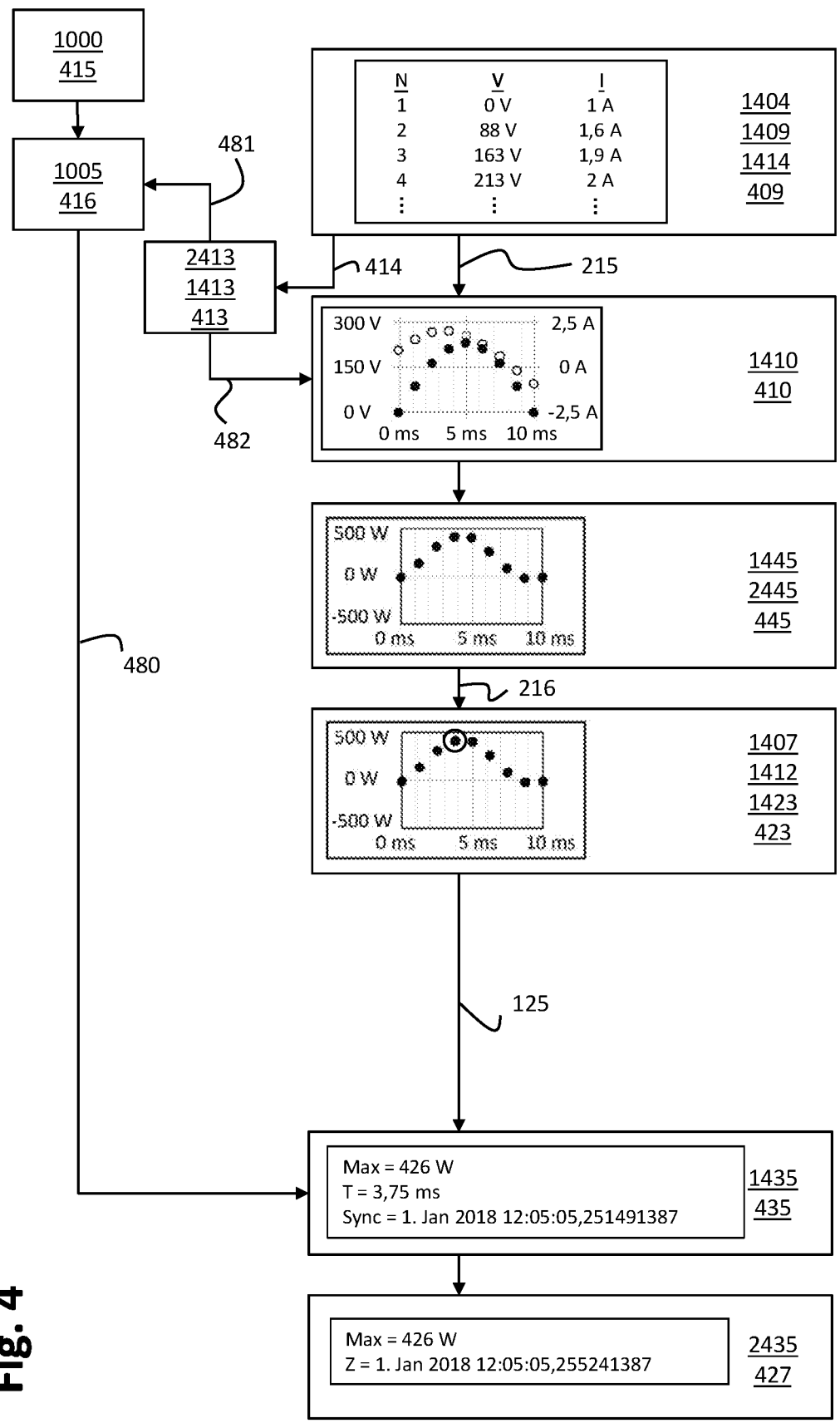
FIG. 4 depicts a flow chart of a method for monitoring a current-supply network by the second bus terminal.

FIG. 4 shows a schematic exemplary flow chart of a method for monitoring a current-supply network using the second bus terminal 201.

As the second bus terminal 201 essentially corresponds to the first bus terminal of FIG. 1 with regard to design and functionality, only the differences are explained in the following in order to avoid repetitions.

In the shown example, two electrical quantities of the current-supply network 403 are measured 1404 by the measuring converter 409, in this case an electrical voltage and a current value of a phase 407 of the current-supply network 403. The individual voltage and current values are provided 1409 by the measuring converter 409. For example, a voltage value of 0V and a current value of 1A are provided 1409 as first measuring data 215, a voltage value of 88V and a current value of 1.6A as second measuring data, a voltage value of 163V and a current of 1.9 A as third measuring data, a voltage value of 213V and a current of 2 A as fourth measuring data, and so on. The provided digital measuring data are individually transmitted to the first link unit 410. The further method is carried out in analogy to the description pertaining to FIG. 2.

In analogy to the example of FIG. 2, as well, the digital measuring data 215 are assigned 1410 to the time signals 482 in the first link unit 410. In the example of FIG. 4, a combined voltage/current/time diagram is generated due to the plurality of measured quantities, which diagram contains a voltage value and a current value every 1.25 milliseconds in the shown example. The amount of the voltage is plotted on the left ordinate axis and the individual voltage values are shown as filled-in spots in FIG. 4. The amount of current is plotted in the right ordinate axis and the individual current values are shown in FIG. 4 as not-filled-in spots. On the axis of abscissae, time is plotted in milliseconds wherein the time refers to the time signals of the second clock 413.

The individual digital measuring values 215 for voltage and current are then received by the evaluation unit and linked to one another 1445. Within the framework of the linking process 1445, the individual voltage and current values of the respective time signals are multiplied with one another in order to generate an output/time diagram. By the individual output values for the respective time signals, first derived data 216 are generated 2445 which are then supplied to search unit 423.

First derived data 216 are then, in the searching unit 423, processed in analogy to the digital measuring data 215 described in conjunction with FIG. 1 in the following method steps.

In the example of FIG. 4, in a first step an inspection 1423 of the first derived data 216 for a predetermined event takes place. In the depicted example, e.g. a maximum output value is searched as a predetermined event. As a result, the searching unit 423 inspects 1423 the first derived data 216 for a maximum value. Finding the maximum output value, i.e. the occurrence 1407 of the predetermined event within the framework of the inspection 1423 is indicated and symbolized in FIG. 4 by a circle around the corresponding value. Due to the occurrence 1423 of the predetermined event, event data 125 are generated 1412 based on the first derived data 216. As the event is the maximum output value 426 W and the time signal 482 of 3.75 ms may be assigned to this maximum output value or, respectively, is based thereon, the event data 125 in this case consist of two values 426 W and 3.75 ms which are then supplied to the second link unit 435.

In the second link unit 435, the event data 125 are then provided 1435 with a time stamp. As described, this time stamp is based on a link the synchronized clock time 480 provided by the first clock and the time signal assigned to the first derived data 216 of the event. According to the example, the synchronized clock time 480 having the value 1 Jan. 2018; 12:05:05.251491387 is added to the value of the time signal 482 at which the searched event, i.e. the maximum output value, occurred, i.e. in the example the value 3.75 ms. This results in a time stamp having the value: 1 Jan. 2018; 12:05:05.255241387.

By providing 1435 the event data 125 with the time stamp, user data 427 are generated 2435 which in a final method step are sent via the communication network 430.

Figure 5:
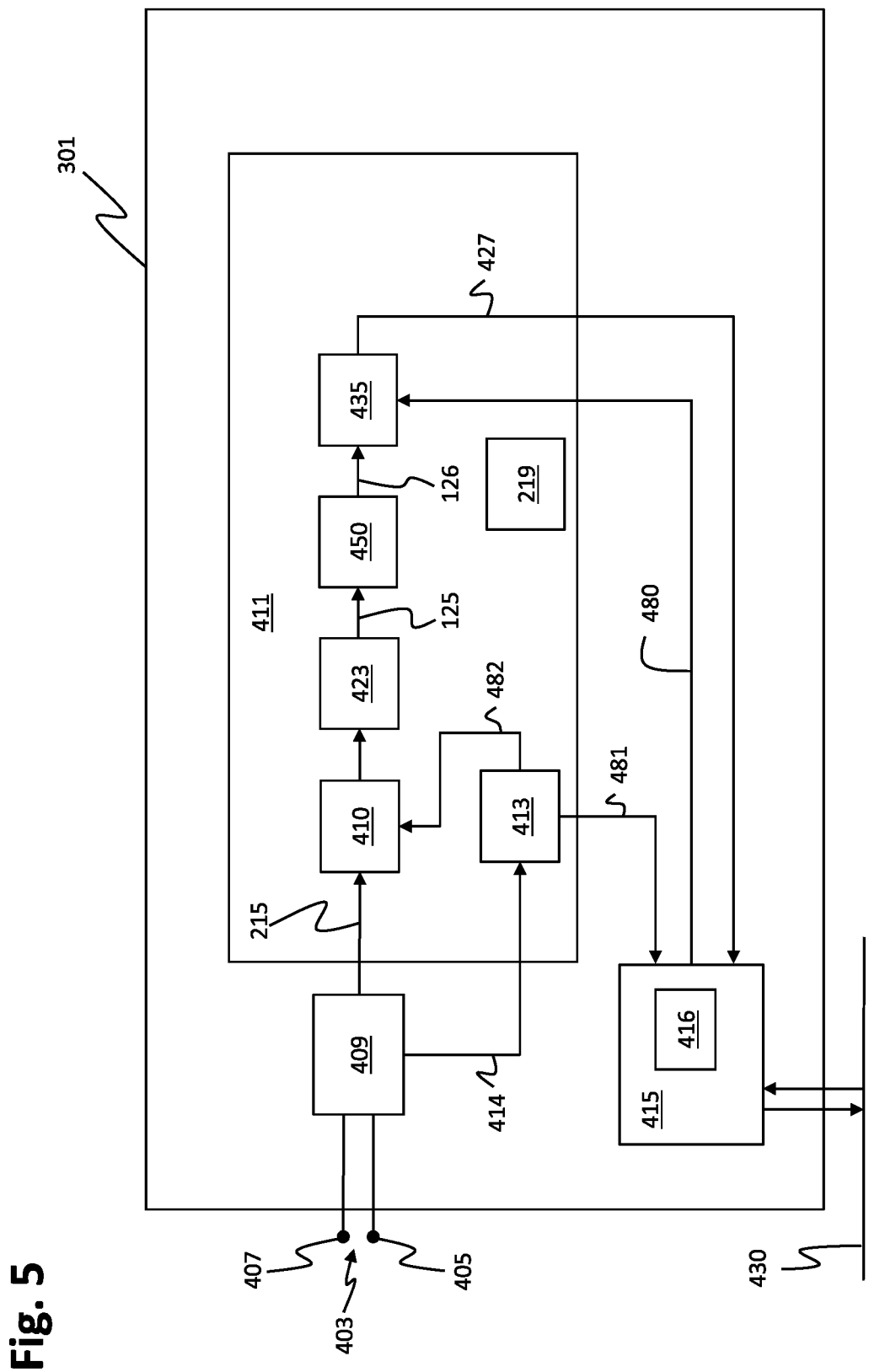
FIG. 5 shows a third bus terminal.

FIG. 5 depicts a third bus terminal 301 of an automation system for monitoring a current-supply network 403.

The third bus terminal 301 essentially corresponds to design and functionality of the first bus terminal 101 according to FIG. 1 so that only the differences are explained in the following in order to avoid repetitions.

Apart from the units of the first bus terminal 101 described in conjunction with FIG. 1, the third bus terminal 301, in particular the processor unit 411, comprises a second evaluation unit 450 which is functionally arranged between the searching unit 423 and the second link unit 435. The second evaluation unit 450 is configured to receive the event data 125 generated by the searching unit 423. The event data 125 are then e.g. linked to further event data 125 and/or the event data 125 are processed by a mathematical function by the second evaluation unit 450. Thus, second derived data 126 are generated from the event data 125 that are transmitted to the second link unit 435 instead of the event data 125 and are further processed in analogy to the above-described procedure with regard to the event data 125.

Figure 6:
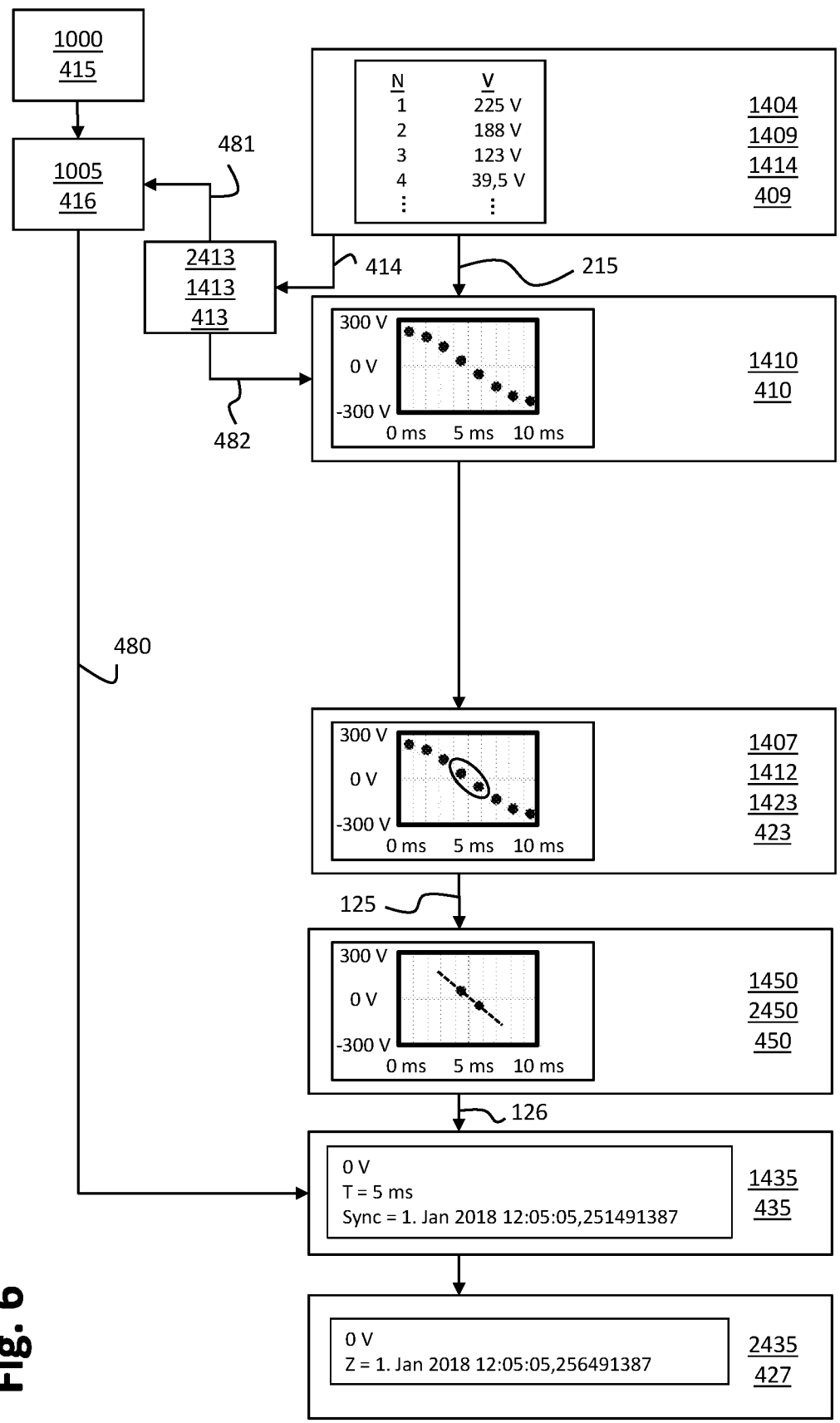
FIG. 6 depicts a flow chart of a method for monitoring a current-supply network by the third bus terminal.

FIG. 6 shows a schematic exemplary flow chart of a method for monitoring a supply-current network using the third bus terminal 301.

As the third bus terminal 301 essentially corresponds to the first bus terminal 101 of FIG. 1 with regard to design and functionality, only the differences are explained in the following in order to avoid repetitions.

In the example depicted in FIG. 6, an electrical quantity of the current-supply network 403 is measured 1404 by the measuring converter 409, in this case an electrical voltage of a phase 407 of the current-supply network 403. The individual voltage values are provided 1409 by the measuring converter 409. For example, a voltage value of 225V is provided 1409 as a first measuring date 215, a voltage value of 188V as a second measuring date 215, a voltage value of 123V as a third measuring date, a voltage value of 39.5V as a fourth measuring date 215 and so on. The further method is carried out in analogy to the description of FIG. 2.

In analogy to the example of FIG. 2, as well, the digital measuring data 215 are assigned 1410 to the time signals 482 in the first link unit 410. In this manner, e.g. a voltage/time diagram is generated which in the shown example comprises a voltage value every 1.25 milliseconds.

In a next step, the digital measuring data 215 are inspected 1423 for a predetermined event. In the shown example, e.g. a change of sign of the voltage value is looked for as the predetermined event for a zero crossing. Hence, the searching unit 423 inspects 1423 the provided digital measuring data 215 for a change of sign. The process of finding the last positive voltage value and the first negative voltage value, i.e. the occurrence 1407 of the predetermined event within the framework of the inspection 1423, is indicated and symbolized in FIG. 6 by a circle around the corresponding values. Due to the occurrence 1423 of the predetermined event, event data 125 are generated 1412 on the basis of the measuring data 215. The event data 125 in this case consist of two voltage values with a respectively associated time signal which are then supplied to the second evaluation unit 450.

The two event data for the voltage are then received by the second evaluation unit 450 and are linked to each other 1450. Within the framework of the linking 1450, a linear approximation of the two voltages in connection with an associated time signals takes place to thus generate the precise point in time or, respectively, the associated time signal of the zero crossing. By the generating process, second derived data 126 are generated 2450 which are then supplied to the second link unit 435.

The second derived data 126 are then treated analogously to the event data 125 described in conjunction with FIG. 1 in the second link unit 435.

In the second link unit 435, the second derived data 126 are then e.g. provided 1435 with a time stamp. As described, said time stamp is based on a linking of the synchronized clock time 480 provided by the first clock and the time signal assigned to the second derived data 126. According to the example, the synchronized clock time 480 is i.e. added to the value 1 Jan. 2018; 12:05:05.251491387 with the derived value of the time signal at which the searched event, i.e. the zero crossing has occurred, i.e. in the example the value 5 ms. This results in a time stamp having the value 1 Jan. 2018; 12:05:05.256491387.

By providing 1435 the second derived data 126 with the time stamp, user data 427 are generated 2435 which are then sent via the communication network 430 in a final method step.

Figure 7:
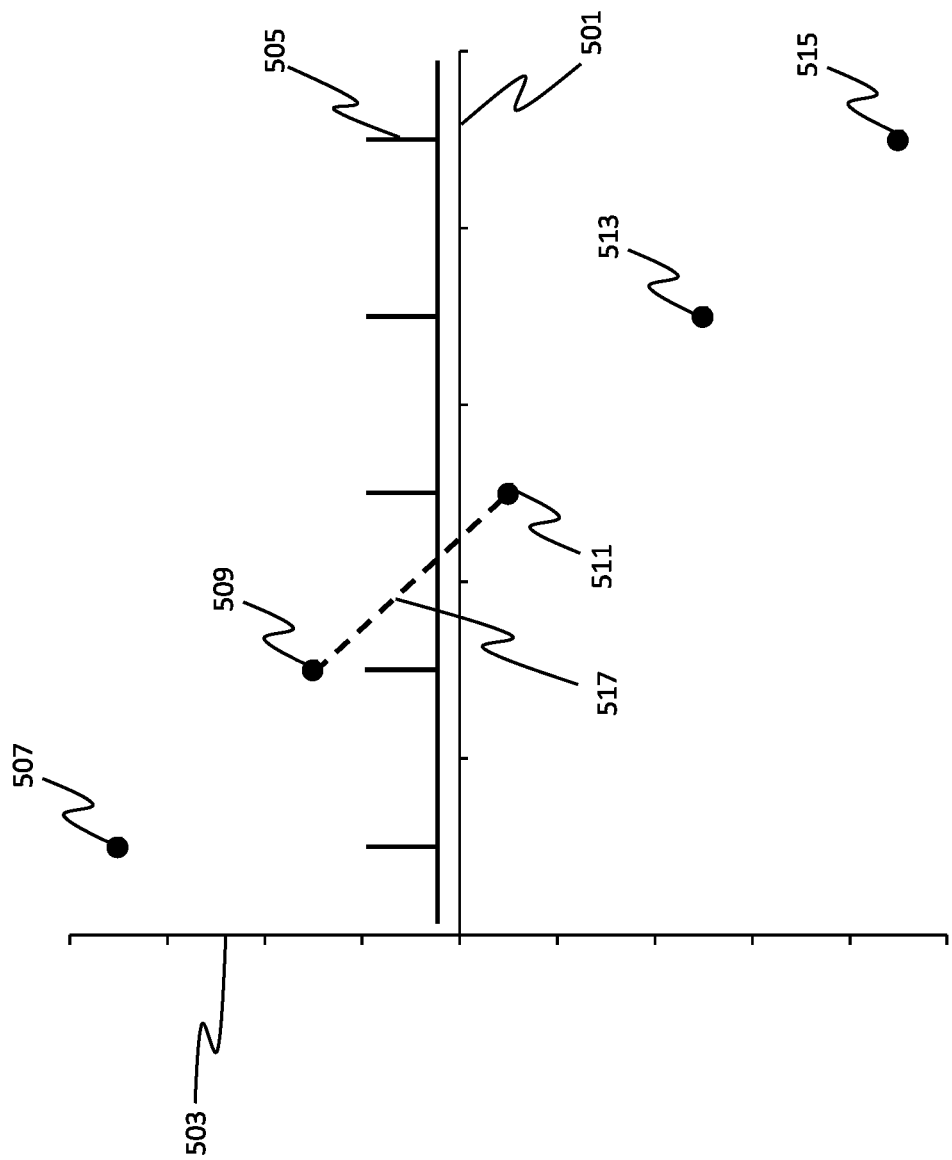
FIG. 7 shows the determination of a zero crossing.

FIG. 7 again shows a zero-crossing determination in more detail, based on a linear approximation. FIG. 7 depicts a graph comprising an abscissa 501 and an ordinate 503.

The abscissa 501 e.g. indicates time in seconds. Ordinate 503 e.g. indicates an electrical voltage that has been measured between the neutral conductor 405 and the phase 407 of the current-supply network 403 shown in FIG. 5.

The graph having reference numeral 505 describes a sampling rate of the analogous measuring data.

The measuring points 507, 509, 511, 513, 515 thus correspond to digital measuring data corresponding to this sampling rate.

For approximation of the zero crossing, a straight line is applied to the two measuring points 509, 511 that are closest to the zero crossing, the straight line corresponding to the following formula:

$$y = m \cdot x + b$$

Here, y is the voltage, m the rise of the straight line, x is time and b the y-section of the axis. By determining the cross point of this function, the zero crossing of the electrical voltage may be approximated.

The next (i.e. future) zero crossing may advantageously be predicted by the instantaneous frequency and the frequency change of the current-supply network 403.

Here, the determination of the zero crossing is e.g. precise to the microsecond.

A distance between two measuring points is e.g. 113 μs at a sampling rate of 9700 measuring data per second.

The operational range of the frequency of the current-supply network to be examined or, respectively, monitored is e.g. 45 Hz to 65 Hz. With a frequency of 50 Hz, the period is 20 ms, hence a zero crossing occurs every 10 ms. The operating time or delay of a low-pass-frequency filter may protract evaluation of the current zero crossing; as a result, e.g. the time of the last-but-one zero crossing is outputted by the bus terminal. For example, the occurrence of the zero crossings respectively triggers a timer. The instantaneous frequency may be measured from a measurement series and a frequency change from the derivation.

According to an embodiment, a bus terminal measures one or a plurality of the following values:
electrical voltage (in a three-phase a.c. network e.g. three voltages (one voltage per phase)), or
electrical current (in a three-phase a.c. network e.g. three electrical currents (one per phase)).

In an embodiment, a sampling rate amounts to 9700 sampling values per second. In one embodiment, a sampling rate is between 8000 sampling values per second and twelve-thousand sampling values per second.

These measured values are evaluated, wherein within the framework of the evaluation one or a plurality of the following values are determined or calculated from said measured values:
the respective effective value of the measured voltage or, respectively, of the measured current, e.g. the three voltages and three currents in a three-phase a.c. network,
the respective effective value of one or of the three phase voltage(s) of an a.c. network,
the respective excess voltage per phase, i.e. for example three excess voltages of an a.c. network (one excess voltage e.g. being an event),
the respective excess current per phase, i.e. for example three excess currents of an a.c. network (one excess current e.g. being an event),
an effective power per phase, an apparent power, a reactive power, a power factor, a frequency,
a last zero crossing of the measured voltage,
a respective harmonics of the string voltages and currents per phase,
a respective active energy per phase and/or a total active energy,
a respective apparent energy per phase and/or a total apparent energy, or
a respective reactive energy per phase and/or a total reactive energy.

Within the framework of the evaluation, according to an embodiment the processor unit e.g. calculates or determines one or a plurality of the following statistical data:
a respective effective power, a respective apparent power and/or a respective reactive power per phase,
a respective maximum value of the three current inputs,
a respective minimum and/or maximum value of the effective values of the respective currents per phase, or
a respective minimum and/or maximum value of the effective value of the respective voltages per phase.

Figure 8:
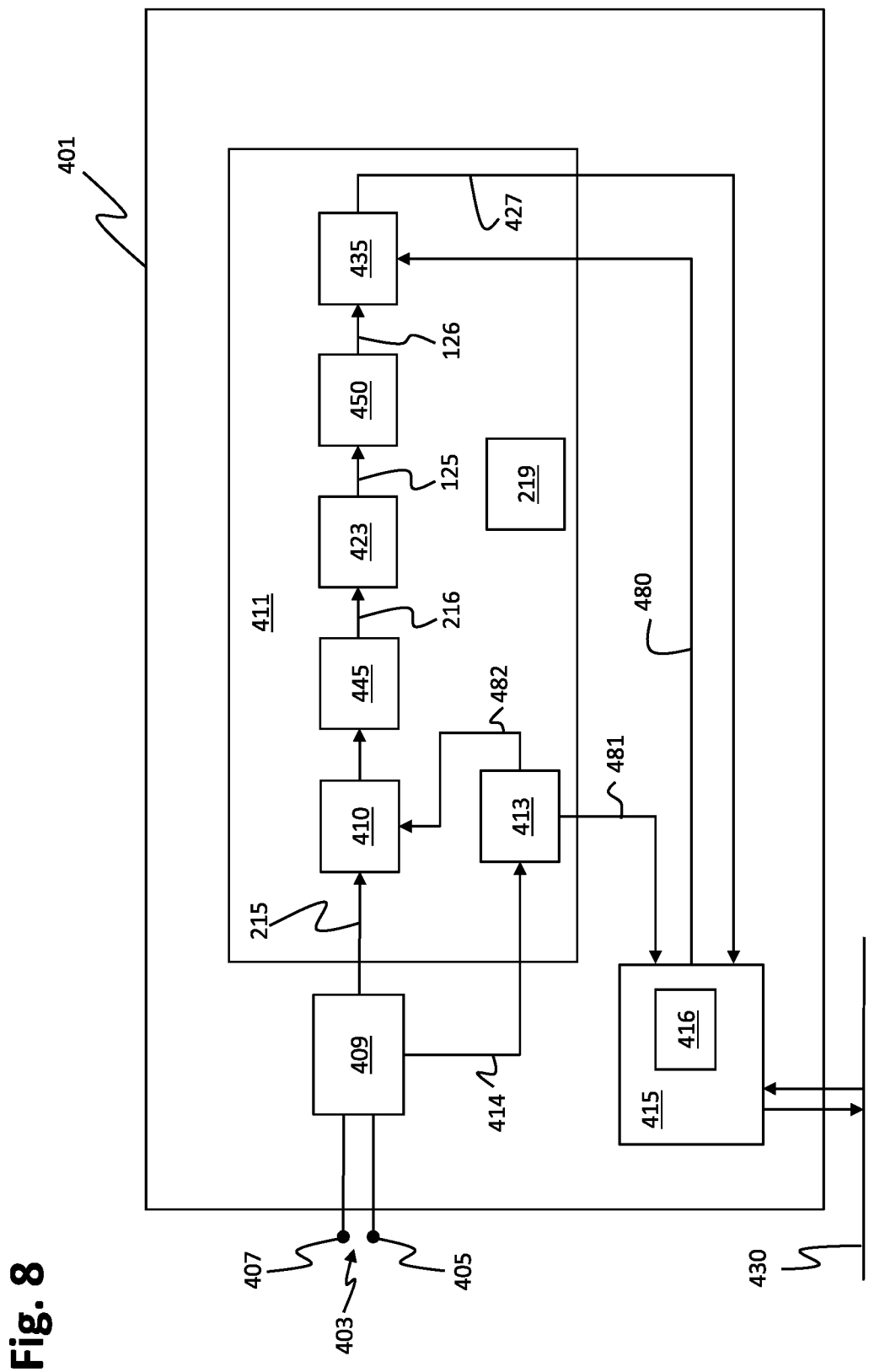
FIG. 8 depicts a fourth bus terminal.

FIG. 8 shows a fourth bus terminal 401 of an automation system for monitoring a current-supply network 403.

With regard to design and functionality, the fourth bus terminal 401 essentially corresponds to a combination of the second bus terminal 101 of FIG. 3 and the third bus terminal of FIG. 5 so that only the differences are explained in the following in order to avoid repetitions.

The fourth bus terminal 401, in particular the processor unit 411, comprises a first evaluation unit 445 which is functionally arranged between the first link unit 410 and the searching unit 423 as well as a second evaluation unit 450 which is functionally arranged between the searching unit 423 and the second link unit 435. The first evaluation unit 445 is configured to receive the digital measuring data 215 assigned by the time signal 482 from the first link unit 410. The digital measuring data 215 are then e.g. linked to further digital measuring data 215 and/or the digital measuring data 215 are processed by a mathematical function by the first evaluation unit 445.

Thus, first derived data 216 are generated from the digital measuring data 215 and then transmitted to the searching unit 423 instead of the digital data 215 and further processed in analogy to the procedure described above with regard to the digital data 215. The second evaluation unit 450 is configured to receive the event data 125 generated by the searching unit 423. The event data 125 are then e.g. linked to further event data 125 by the second evaluation unit 450 and/or the event data 125 are processed by a mathematical function. In this way, second derived data 126 are generated from the event data 125 which are then transmitted to the second link unit 435 instead of the event data 125 and further processed in analogy to the procedure described above with regard to the event data 125.

Figure 9:
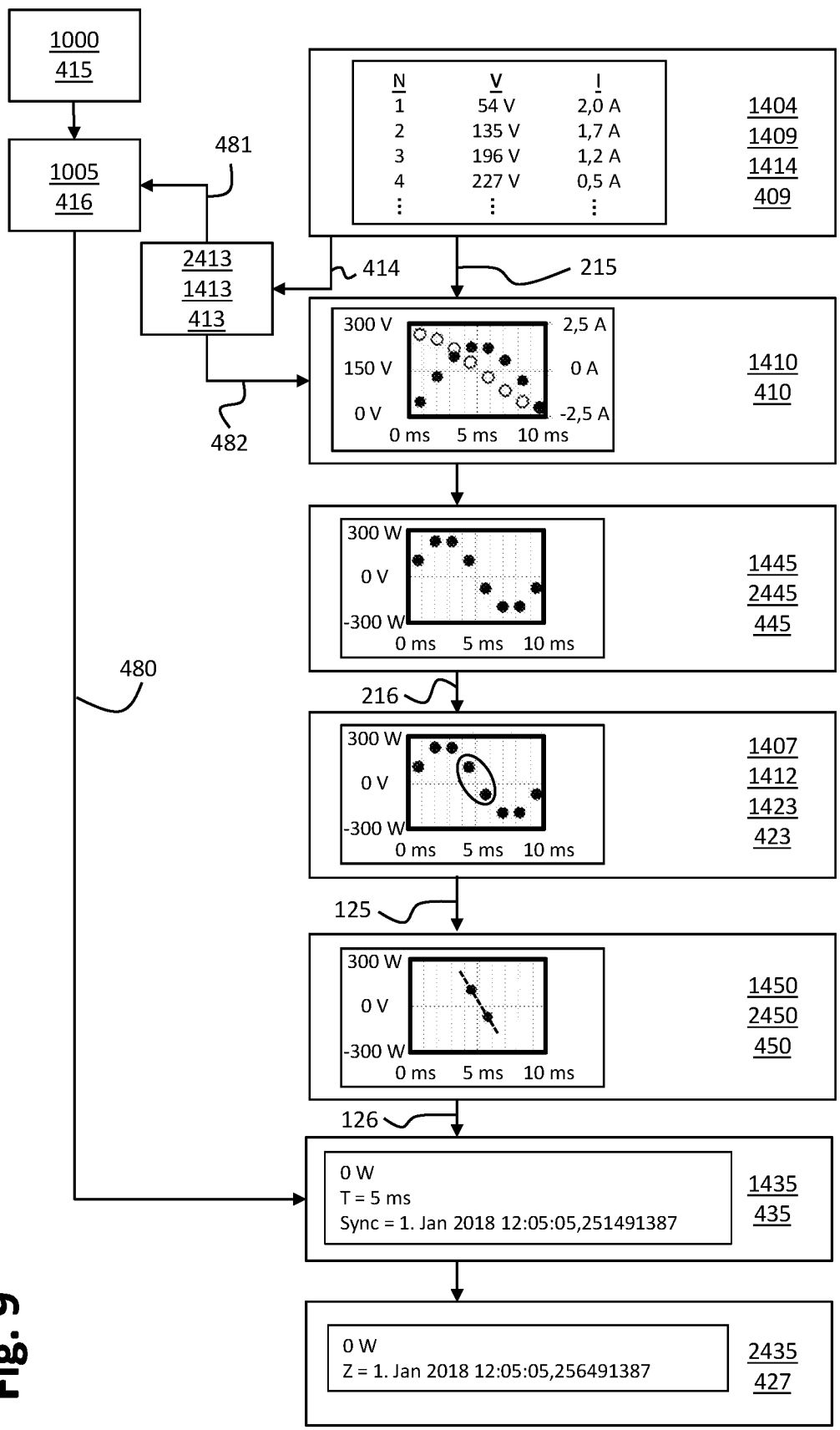
FIG. 9 shows a flow chart of a method for monitoring a current-supply network by a fourth bus terminal.

FIG. 9 shows a schematic exemplary flow chart of a method for monitoring a current-supply network using the fourth bus terminal 401.

As the fourth bus terminal 401 essentially corresponds to the second bus terminal 101 of FIG. 3 and to the third bus terminal of FIG. 5 with regard to design and functionality, only the differences are described in the following in order to avoid repetitions.

In the depicted example, two electrical quantities of the current-supply network 403 are measured 1404 by the measuring converter 409, in this case measuring 1404 of an electrical voltage and measuring of a current of a phase 407 of the current-supply network 403. The individual voltage values and the individual current values are provided 1409 by the measuring converter 409. For example, a voltage value of 54V and a current value of 2A are provided 1409 as first measuring data 215, a voltage of 135V and a current of 1.7 A as second measuring data 215, a voltage of 196V and a current of 1.2 A as third measuring data 215, a voltage of 227V and a current of 0.5 A as fourth measuring data 215 and so on. The provided digital measuring data 215 are individually transmitted to the first link unit 410. The further procedure is carried out in analogy to the description of FIG. 2.

In analogy to the example of FIG. 2, as well, an assigning 1410 of the digital measuring data 215 to the time signals 482 takes place in the first link unit 410. In the example of FIG. 9, a combined voltage/current-time diagram is generated based on the plurality of measured quantities, the diagram comprising one voltage and one current value every 1.25 milliseconds. The amount of voltage is plotted on the left ordinate and the individual voltage values are depicted in FIG. 9 as filled-in spots. The current amount is plotted on the right ordinate and the individual current values are depicted in FIG. 9 as not-filled-in spots. On the abscissa, time is plotted in milliseconds, time referring to the time signals of the second clock 413.

The individual digital measuring values 215 for voltage and current are then received by the first evaluation unit 445 and linked to each other 1445. Within the framework of the linking process 1445, the individual values of voltage and current of the respective time signals are multiplied with each other, thus generating a power/time diagram. By the individual values of the power for the respective time signals, first derived data 216 are then generated 2445 which are then supplied to the searching unit 423.

In a next step, the first derived data 216 are inspected 1423 for a predetermined event. In the depicted example, e.g. a change of sign of the power values are searched for as a predetermined event of a zero crossing. As a result, the search unit 423 inspects 1423 the first derived data 216 for a change of sign. Finding the last positive power value and the first native power value, i.e. the occurrence 1407 of the predetermined event, within the framework of the inspection 1423 is indicated and symbolized in FIG. 9 by a circle around the corresponding values. Due to the occurrence 1423 of the predetermined event, event data 125 are generated 1412 on the basis of the first derived data 216. The event data 125 in this case consist of the two power values with the respectively assigned time signal which are then supplied to the second evaluation unit 450.

The two event data for the electrical power are then received by the second evaluation unit 450 and linked to each other 1450. Within the framework of the linking process 1450, a linear approximation of the two power values is carried out in conjunction with the associated time signals in order to thus generate the exact point in time or, respectively, the associated time signal of the zero crossing. By the generation, second derived data 126 are generated 2450 which are then supplied to the second link unit 435.

In the second link unit 435, second derived data 126 are then treated analogously to the event data 125 described in conjunction with FIG. 1.

In the second link unit 435, the second derived data 126 are then e.g. provided 1435 with a time stamp. As described, said time stamp is based on a link of the synchronized clock time 480 provided by the first clock and the time signal assigned to the second derived data 126. According to the example, the synchronized clock time 480 having the value 1 Jan. 2018; 12:05:05.251491387 is added to the derived value of the time signal at which the searched event, i.e. the zero crossing, has occurred, i.e. in the example the value 5 ms. This results in a time stamp having the value 1 Jan. 2018; 12:05:05.256491387.

Figure 10:
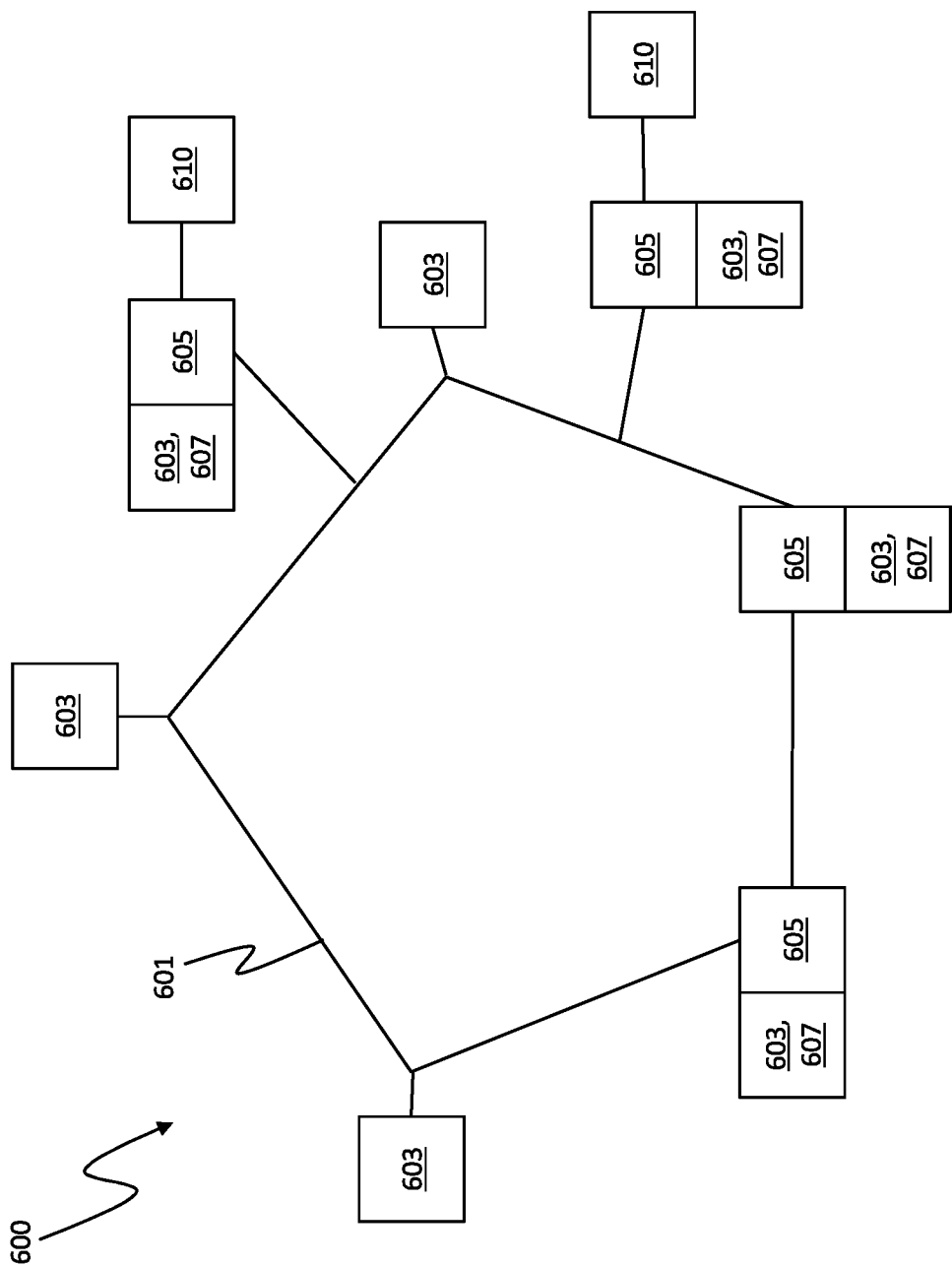
FIG. 10 shows a first current-supply network.

FIG. 10 shows a first current-supply network 601 comprising a first automation system 600 wherein the first automation system 600 comprises a communication network and a control unit.

The first automation system 600 comprises a plurality of bus terminals 603 for monitoring the current-supply network 601. The bus terminals 603 are e.g. configured as one of the above-described first to fourth bus terminals 101, 201, 301, 401.

The plurality of bus terminals 603 e.g. determine the zero crossings of a voltage of the current-supply network 601.

Some of the bus terminals 603 each have a switch 605 in order to interrupt the current-supply network 601 at the corresponding location within the current-supply network 601. These bus terminals 603 have additionally been given the reference numeral 607. The local measurement within the bus terminals 607 may be used to switch the switches 605 in a zero crossing of the voltage. In this way, the loads or, respectively, consumers 610 connected downstream to the switches 605 may efficiently be separated from the current-supply network 601, thus keeping wear of the switches 605 lower compared to randomly switching to any phase of the voltage.

Due to the fact that the point in time of a voltage-zero crossing determined by a first of the plurality of bus terminals 603 is based on a reference time applicable for the entire automation system 600, it is possible—provided that the distances between the various points in the current-supply network 601 are known—for the control unit of the automation system 600 to predict at which points in time a zero crossing at a different point in the current-supply network 601 is going to occur. In this way, e.g. the bus terminals 607 assigned to the switches 605 may be made obsolete as for these measuring points the time of the zero crossing may efficiently be predicted.

As a result, it is provided according to one embodiment that the bus terminals 607 at the switches 605 are made obsolete as the switches may be informed on the time of a predicted zero crossing via the communication network.

Figure 11:
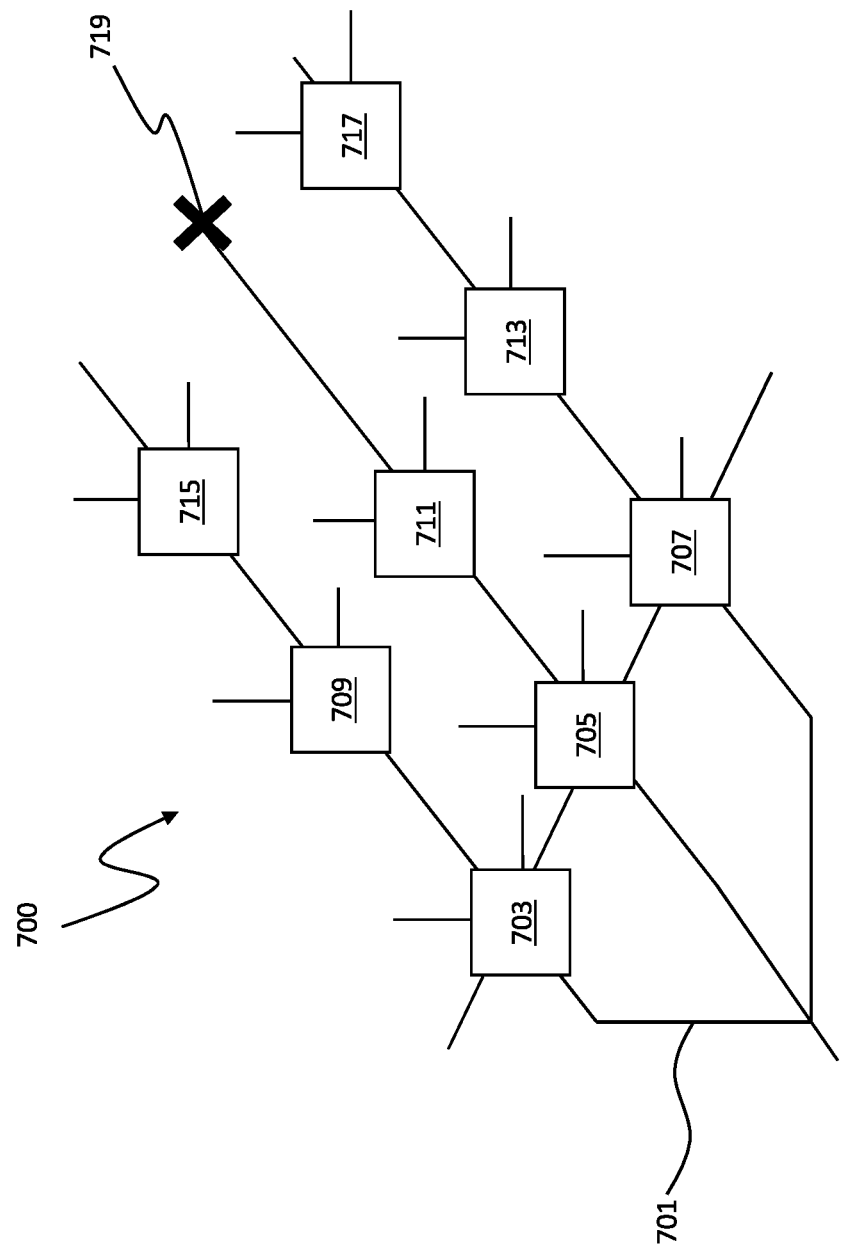
FIG. 11 depicts a second current-supply network.

FIG. 11 shows a second current-supply network 701 comprising a second automation system 700, wherein the second automation system 700 comprises a communication network and a control unit.

The second current-supply network 701 comprises a plurality of nodes 703, 705, 707, 709, 711, 713, 715, 717, each connected to a bus terminal and a fuse. At said nodes, the bus terminals monitor the current-supply network 701 and the fuses protect the current-supply network against excess current.

The bus terminals are e.g. configured as one of the above-described first to fourth bus terminals 101, 201, 301, 401.

The cross having reference numeral 719 in FIG. 11 indicates a location at which a short circuit has occurred. The voltage drop resulting therefrom will spread in the current-supply network 701 at the speed of light at most. With a distance of at least 333 m between the nodes, which corresponds to a minimum spread time of the voltage drop between nodes of 1 µs, the time and space-related spread of the voltage drop may be detected by the bus terminals, as the bus terminals have a time resolution of events such as voltage drops of 1 µs.

This allows for a direct reconstruction of the location 719 at which the error in the current-supply network 701 has occurred with a precision of at least 333 m or, respectively, relative to the position of the existing bus terminals.

This allows for determining the part of the current-supply network 701 that should reasonably be cut off immediately after the occurrence of the error.

A further advantage is that the error-search range may be very considerably limited.

In current-supply networks known so far, it was possible that a fuse at the nodes 703, 705 or 707 interrupted the corresponding current line upstream of a fuse at the node 711, thus unnecessarily cutting off a large part of the current-supply network 701.

Due to the information available because of the timely spread of the voltage drop which is measured by the inventive bus terminals and provided via the communication network, a fuse at node 711 may be triggered belatedly and the other parts of the current-supply network 701 may be released. In known current-supply networks, an active search for the error would at first have been necessary and only after finding the error would it have been possible to release the string downstream of node 703.

As a result, the inventive concepts allows for efficiently localizing errors in the current-supply network.

In summary, providing parameters of a distributed current-supply network measured at specific locations or, respectively, specific events (such as voltage drop, zero crossing of a voltage) with a time stamp that is determined on the basis of a synchronized internal clock of the bus terminal and based on a reference time valid for the entire automation system and having a time-link to the measuring data. This means that the bus terminal e.g. links a measured parameter or, respectively, a specific event in an a.c. network to a time synchronized for the entire automation system. In this manner, the value of the parameter or, respectively, the point in time of the event may be chronologically categorized for the entire automation system.

This invention has been described with respect to exemplary embodiments. It is understood that changes can be made and equivalents can be substituted to adapt these disclosures to different materials and situations, while remaining with the scope of the invention. The invention is thus not limited to the particular examples that are disclosed, but encompasses all the embodiments that fall within the scope of the claims.

What is claimed is:

1. A bus terminal for an automation system for monitoring a current-supply network, wherein the bus terminal comprises:
   a first clock,
   a communication interface for communicating via a communication network of an automation system,
      wherein the communication network is configured to receive a reference time via the communication network,
   wherein the communication interface is configured to synchronize the clock time of the first clock with the reference time,
   a measuring converter configured as a digitizer for measuring one or a plurality of electrical quantities of the current-supply system in order to provide digital measuring data correspondingly based on the one or on the plurality of measured electrical quantities, and
   a processor unit comprising:
      a second clock configured to generate a time signal based on a provision signal supplied to the second clock by the measuring converter, wherein the second clock is furthermore configured to trigger the first clock to periodically provide the synchronized clock time,
      a first link unit configured to assign the time signal to the provided digital measuring data,
      a searching unit configured to inspect the provided digital measuring data and/or the first derived data based on the provided digital measuring data for the occurrence of one or a plurality of predetermined events in order to generate event data based on the digital measuring data and/or on the first derived data of the event or of the events on the basis of determining the occurrence of one or a plurality of predetermined events, and
      a second link unit configured to confer a time stamp to the event data and/or to the derived data based on the event data in order to generate user data in this way, wherein the time stamp is based on a linking of the synchronized clock time provided by first clock and the time signal assigned to the digital measuring data of the event or of the events,
   wherein the communication interface is configured to transmit the generated user data via the communication network.

2. The bus terminal according to claim 1, wherein the processor unit comprises a first evaluation unit that receives the digital measuring data assigned by the time signal from the first link unit, wherein the first evaluation unit is configured to link the digital measuring data to further digital measuring data and/or to process the digital measuring data by a mathematical function in order to generate first derived data that is supplied to the searching unit.

3. The bus terminal according to claim 1, wherein the processor unit comprises a second evaluation unit receiving the event data from the searching unit, wherein the second evaluation unit is configured to link the event data to further event data and/or to further digital measuring data and/or to process the event data by a mathematical function in order to generate second derived data in this way that is supplied to the second link unit.

4. The bus terminal according to claim 1, wherein the one or the plurality of predetermined events are selected from the following group of events:
   a voltage drop in the current-supply network below a predetermined voltage-threshold value,
   a current drop in the current-supply network below the predetermined current-threshold value,
   a current increase in the current-supply network over a predetermined current-threshold value,
   a chronological development of a measured electrical quantity corresponding to a predetermined desired time development or deviating from it, and/or
   the occurrence of a zero crossing of a phase in a current-supply network configured as an a.c. network.

5. The bus terminal according claim 1, comprising a memory for storing one or a plurality of programs for inspecting by the searching unit for generating first derived data by the first evaluating unit and/or for generating second derived data by the second evaluating unit, wherein the processor unit is configured to read out and execute the program or the programs stored in the memory, wherein the communication interface is configured to receive the program or the programs and/or update data for the program or the programs via the communication network, wherein the processor unit is configured to store the received program or programs in the memory and/or to update the program or programs based on the update data.

6. A method for monitoring a current-supply network, comprising the following steps:
receiving a reference time via a communication network,
synchronizing a clock time of a first clock to a reference time,
measuring one or a plurality of electrical quantities of the current-supply network by a measuring converter configured as a digitizer,
providing digital measuring data based on the one or plurality of measured electrical quantities,
supplying a provision signal from the measuring converter to a second clock as soon as digital measuring data have been provided,
generating a time signal on the part of the second clock when the provision signal is supplied,
periodic triggering of the first clock to provide a synchronized clock time on the part of the second clock,
assigning a time signal to the provided digital measuring data,
inspecting the provided digital measuring data and/or first derived data based on the provided digital measuring data for the occurrence of one or a plurality of predetermined events,
based on determining the occurrence of one or a plurality of predetermined events, generating of corresponding event data based on the digital measuring data and/or on first derived data of the event or events,
conferring a time stamp to the event data and/or to the second derived data based on the event data, wherein the time stamp is based on a link of the synchronized clock time provided by the first clock and the time signal assigned to the digital measuring data of the event or of the events,
generating of user data from the event data comprising the time stamp and/or from the second derived data comprising the time stamp on which the event data are based, and
transmitting the generated user data via the communication network.

7. The method according to claim 6, comprising the further steps:
receiving digital measuring data assigned by the time stamp from a first evaluation unit,
generating first derived data by linking the digital measuring data with further digital measuring data and/or processing the digital measuring data by a mathematical function, and
supplying the first derived data to the searching unit.

8. The method according to claim 6, comprising the further steps:
receiving the event data from a second evaluation unit,
generating second derived data by linking the event data to further event data and/or processing the event data by a mathematical function, and
supplying the second derived data to the second link unit.

9. A method for monitoring a current-supply network, comprising the following steps:
providing measuring data based on the one or plurality of measured electrical quantities of the current-supply network,
assign a time signal to the provided measuring data,
inspecting the provided measuring data for the occurrence of one or a plurality of predetermined events,
based on determining the occurrence of one or a plurality of predetermined events, generating of corresponding event data based on the measuring data,
conferring a time stamp to the event data, wherein the time stamp is based on a link of a synchronized clock time provided by a clock and the time signal assigned to the measuring data of the event,
generating of user data from the event data comprising the time stamp, and
transmitting the generated user data via ae communication network.

10. The method according to claim 9, wherein the one or the plurality of predetermined events are selected from the following group of events:
a voltage drop in the current-supply network below a predetermined voltage-threshold value,
a current drop in the current-supply network below the predetermined current-threshold value,
a current increase in the current-supply network over a predetermined current-threshold value,
a chronological development of a measured electrical quantity corresponding to a predetermined desired time development or deviating from it, or
the occurrence of a zero crossing of a phase in a current-supply network configured as an a.c. network.

11. The method according to claim 9, comprising the following steps:
receiving a reference time via a communication network,
synchronizing a clock time of a first clock to a reference time,
measuring one or a plurality of electrical quantities of the current-supply network,
providing the measuring data based on the one or plurality of measured electrical quantities,
supplying a provision signal to a second clock as soon as the measuring data have been provided,
generating the time signal on the part of the second clock when the provision signal is supplied,
periodic triggering of the first clock to provide a synchronized clock time on the part of the second clock,
assigning the time signal to the provided measuring data,
inspecting the provided measuring data for the occurrence of one or a plurality of predetermined events,
based on determining the occurrence of one or a plurality of predetermined events, generating of the event data based on the measuring data,
conferring the time stamp to the event data, wherein the time stamp is based on a link of the synchronized clock time provided by the first clock and the time signal assigned to the measuring data of the event or of the events,
generating of the user data from the event data comprising the time stamp, and
transmitting the generated user data via the communication network.

12. The method according to claim 11, comprising the further steps:
- receiving measuring data assigned by the time stamp from a first evaluation unit,
- generating first derived data by linking the measuring data with further measuring data and/or processing the measuring data by a mathematical function, and
- supplying the first derived data to the searching unit.

13. The method according to claim 12, comprising the further steps:
- receiving the event data from a second evaluation unit,
- generating second derived data by linking the event data to further event data and/or processing the event data by a mathematical function, and
- supplying the second derived data to the second link unit.

* * * * *